(12) United States Patent
Im et al.

(10) Patent No.: US 12,360,624 B2
(45) Date of Patent: Jul. 15, 2025

(54) TRANSPARENT DISPLAY DEVICE WITH A TOUCH CONNECTION PORTION INCLUDING A HIGH RESISTANCE LINE

(71) Applicant: LG Display Co., Ltd., Seoul (KR)

(72) Inventors: Jonghyeok Im, Paju-si (KR); JaeHee Park, Paju-si (KR); MiReum Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/540,685

(22) Filed: Dec. 14, 2023

(65) Prior Publication Data
US 2024/0118761 A1   Apr. 11, 2024

Related U.S. Application Data

(63) Continuation of application No. 17/977,878, filed on Oct. 31, 2022, now Pat. No. 11,886,653.

(30) Foreign Application Priority Data

Dec. 14, 2021   (KR) ........................ 10-2021-0178788

(51) Int. Cl.
| | |
|---|---|
| *G06F 3/041* | (2006.01) |
| *G06F 3/044* | (2006.01) |
| *H10K 59/124* | (2023.01) |
| *H10K 59/126* | (2023.01) |
| *H10K 59/40* | (2023.01) |

(52) U.S. Cl.
CPC ........ *G06F 3/0412* (2013.01); *G06F 3/04164* (2019.05); *G06F 3/0418* (2013.01); *G06F 3/0443* (2019.05); *H10K 59/124* (2023.02); *H10K 59/126* (2023.02); *H10K 59/40* (2023.02); *G06F 2203/04103* (2013.01); *G06F 2203/04111* (2013.01)

(58) Field of Classification Search
CPC ..................................................... G06F 3/0412
See application file for complete search history.

(56) References Cited

U.S. PATENT DOCUMENTS

| | | | |
|---|---|---|---|
| 11,093,061 B2 | 8/2021 | Yoo et al. | |
| 11,552,277 B2 * | 1/2023 | Taguchi | ................. H10K 50/81 |
| (Continued) | | | |

FOREIGN PATENT DOCUMENTS

KR   20180049349 A   5/2018

*Primary Examiner* — Chun-Nan Lin
(74) *Attorney, Agent, or Firm* — Seed IP Law Group LLP

(57) ABSTRACT

A transparent display device is provided, which may reduce or minimize loss of light transmittance due to a touch sensor and a touch line, and may repair a defective touch sensor. The device includes a substrate provided with a plurality of transmissive areas and a non-transmissive area, including a plurality of light emission areas, a plurality of touch sensors respectively provided in the plurality of transmissive areas, including a touch sensor electrode, a plurality of touch lines provided in the non-transmissive area and extended in a first direction, a plurality of touch bridge lines provided in the non-transmissive area over the substrate and extended in a second direction to be connected to one of the plurality of touch lines, and a plurality of touch connection portions connecting the plurality of touch bridge lines with the plurality of touch sensors, including a high resistance line.

20 Claims, 11 Drawing Sheets

(56) References Cited

U.S. PATENT DOCUMENTS

| | | | |
|---|---|---|---|
| 11,567,618 B2* | 1/2023 | Li | G06F 3/0412 |
| 2017/0285801 A1* | 10/2017 | Choi | G06F 3/0446 |
| 2018/0233551 A1* | 8/2018 | Choi | H10K 50/844 |
| 2018/0284927 A1* | 10/2018 | Kim | H10K 59/126 |
| 2018/0341348 A1* | 11/2018 | Zeng | C23C 14/08 |
| 2019/0198800 A1* | 6/2019 | Kim | H10K 59/00 |
| 2019/0198806 A1* | 6/2019 | Im | H10K 50/865 |
| 2020/0174609 A1* | 6/2020 | Yoo | G06F 3/047 |
| 2020/0212154 A1* | 7/2020 | Kim | H10K 59/131 |
| 2022/0093697 A1* | 3/2022 | Hong | H10K 59/65 |
| 2022/0109028 A1* | 4/2022 | Park | G06F 3/0443 |
| 2022/0181400 A1* | 6/2022 | Choi | H10K 50/86 |
| 2023/0185392 A1* | 6/2023 | Im | G06F 3/0443 |
| | | | 345/174 |
| 2023/0195253 A1* | 6/2023 | Park | H10K 59/00 |
| | | | 345/174 |

\* cited by examiner

TRANSPARENT DISPLAY DEVICE WITH A TOUCH CONNECTION PORTION INCLUDING A HIGH RESISTANCE LINE

CROSS-REFERENCE TO RELATED APPLICATION(S)

This application claims priority to U.S. application Ser. No. 17/977,878, filed Jun. 15, 2023, and of Korean Patent Application No. 10-2022-0190208 filed on Dec. 30, 2022, in the Korean Intellectual Property Office, the disclosures of which is incorporated herein by reference.

BACKGROUND

Technical Field

The present disclosure relates to a transparent display device.

Description of the Related Art

With the advancement of the information age, the demand for a display device for displaying an image has increased in various forms. Therefore, various types of display devices such as a liquid crystal display (LCD) device, a plasma display panel (PDP) device, a quantum dot light emitting display (QLED) device and an organic light emitting display (OLED) device have been recently used.

Recently, studies for a transparent display device in which a user may view objects or images positioned at an opposite side through the display device are actively ongoing. The transparent display device includes a display area on which an image is displayed, wherein the display area may include a transmissive area capable of transmitting external light and a non-transmissive area, and may have high light transmittance through the transmissive area.

A transparent display device may be provided with a plurality of touch sensors and a plurality of touch lines to implement a touch function.

BRIEF SUMMARY

However, the transparent display device in the related art has technical problems in that it is not easy to form the plurality of touch sensors and the plurality of touch lines, or the formation process is complicated. Further problems include light transmittance being reduced due to the plurality of touch sensors and the plurality of touch lines. The present disclosure has been made in view of the various technical problems in the related art including the above identified problems.

One or more embodiments of the present disclosure provide a transparent display device that may reduce or minimize loss of light transmittance due to a touch sensor and a touch line.

One or more embodiments of the present disclosure provide a transparent display device that may repair a defective touch sensor.

In addition to the technical benefits of the present disclosure as mentioned above, additional benefits and features of the present disclosure will be clearly understood by those skilled in the art from the following description of the present disclosure.

In accordance with an aspect of the present disclosure, the above and other objects can be accomplished by the provision of a transparent display device comprising a substrate provided with a plurality of transmissive areas and a non-transmissive area disposed between the transmissive areas adjacent to each other, including a plurality of light emission areas, a plurality of touch sensors respectively provided in the plurality of transmissive areas over the substrate, including a touch sensor electrode, a plurality of touch lines provided in the non-transmissive area over the substrate and extended in a first direction, a plurality of touch bridge lines provided in the non-transmissive area over the substrate and extended in a second direction to be connected to one of the plurality of touch lines, and a plurality of touch connection portions connecting the plurality of touch bridge lines with the plurality of touch sensors, including a high resistance line.

In accordance with another aspect of the present disclosure, the above and other objects can be accomplished by the provision of a transparent display device comprising a substrate provided with a plurality of transmissive areas and a non-transmissive area disposed between the transmissive areas adjacent to each other, including a plurality of light emission areas, a plurality of light emitting elements respectively provided in the plurality of light emission areas over the substrate, including an anode electrode, a light emitting layer and a cathode electrode, a plurality of driving transistors connected to the anode electrode of each of the light emitting elements, including an active layer, a gate electrode, a source electrode and a drain electrode, a plurality of touch sensors respectively provided in the plurality of transmissive areas over the substrate, including a touch sensor electrode provided in the same layer as the cathode electrode, a plurality of touch bridge lines provided in the non-transmissive area, and a plurality of touch connection portions connecting the plurality of touch bridge lines with the plurality of touch sensors, including a touch contact electrode provided in the transmissive area and a touch connection line formed in a layer provided between the substrate and the driving transistor.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
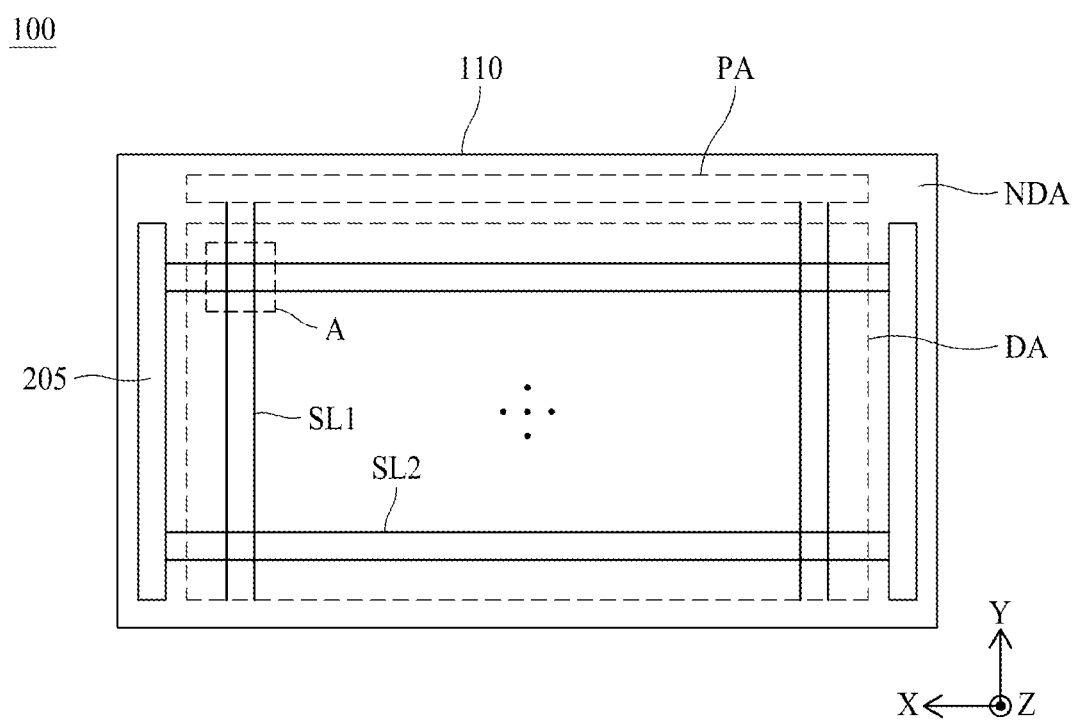
FIG. 1 is a schematic plan view illustrating a transparent display device.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, dimensions (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a schematic plan view illustrating a transparent display device.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, a transparent display device according to one embodiment of the present disclosure includes a transparent display panel 110. The transparent display panel 110 may include a display area DA provided with pixels to display an image, and a non-display area NDA for not displaying an image.

The display area DA may be provided with a first signal lines SL1, a second signal lines SL2 and the pixels. The non-display area NDA may be provided with a pad area PA in which pads are disposed, and at least one scan driver 205.

The first signal lines SL1 may be extended in a first direction (e.g., Y-axis direction). The first signal lines SL1 may cross the second signal lines SL2 in the display area DA. The second signal lines SL2 may be extended in the display area DA in a second direction (e.g., X-axis direction). The pixel may be provided in an area where the first signal line SL1 and the second signal line SL2 cross each other, and emits predetermined light to display an image.

The scan driver 205 are connected to the scan lines and supplies scan signals to the scan lines. The scan driver 205 may be disposed in the non-display area NDA on one side or both sides of the display area DA of the transparent display panel 110 by a gate driver in panel (GIP) method or a tape automated bonding (TAB) method.

The transparent display panel 110 may further include a touch line and a touch sensor in addition to the first signal line SL1, the second signal line SL2 and the pixel in order to implement a touch function. A detailed description of the touch line and the touch sensor will be described later with reference to FIGS. 2 to 11.

Figure 2:
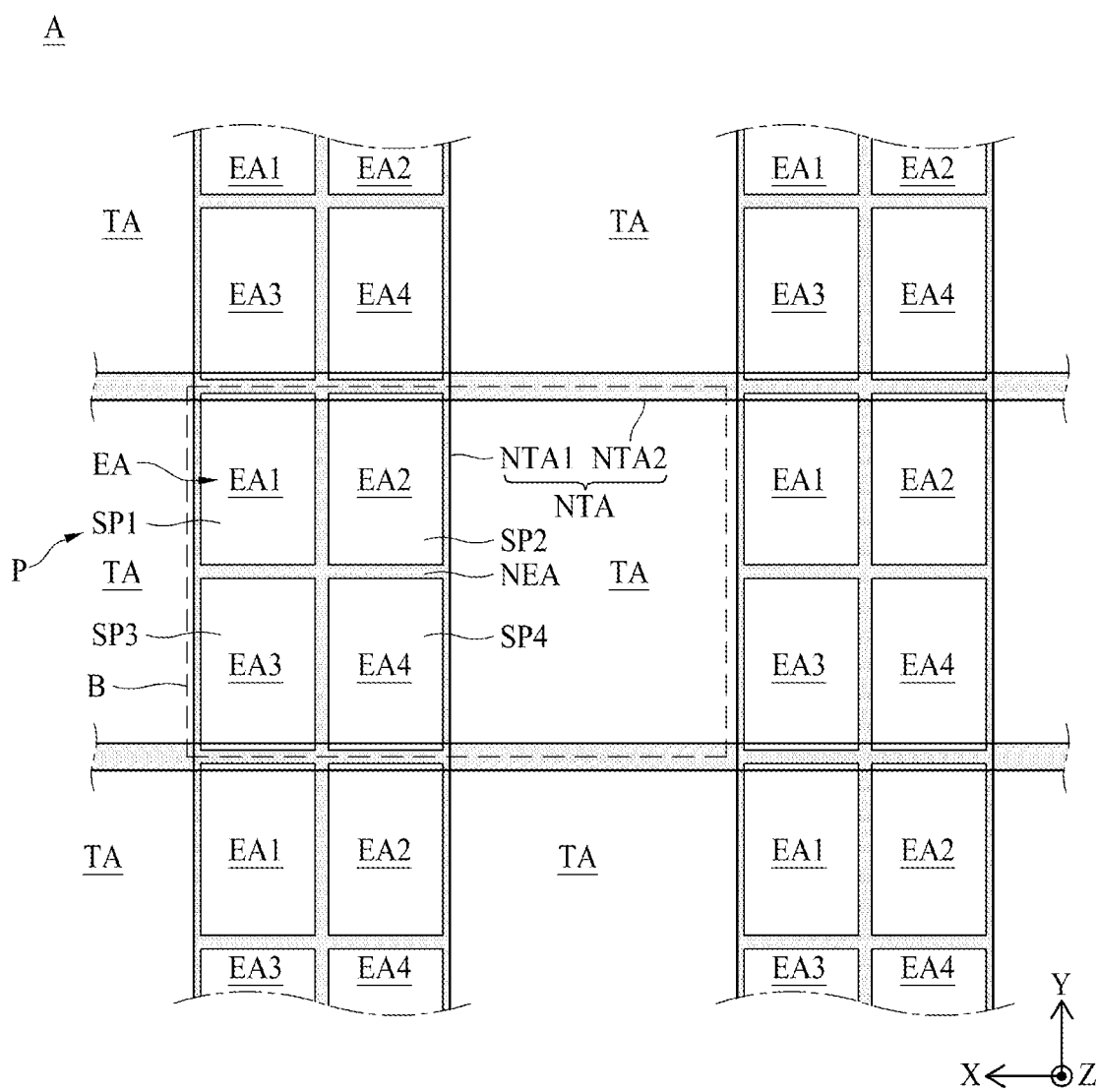
FIG. 2 is a schematic view illustrating an example of a pixel provided in an area A of FIG. 1.
Figure 3:
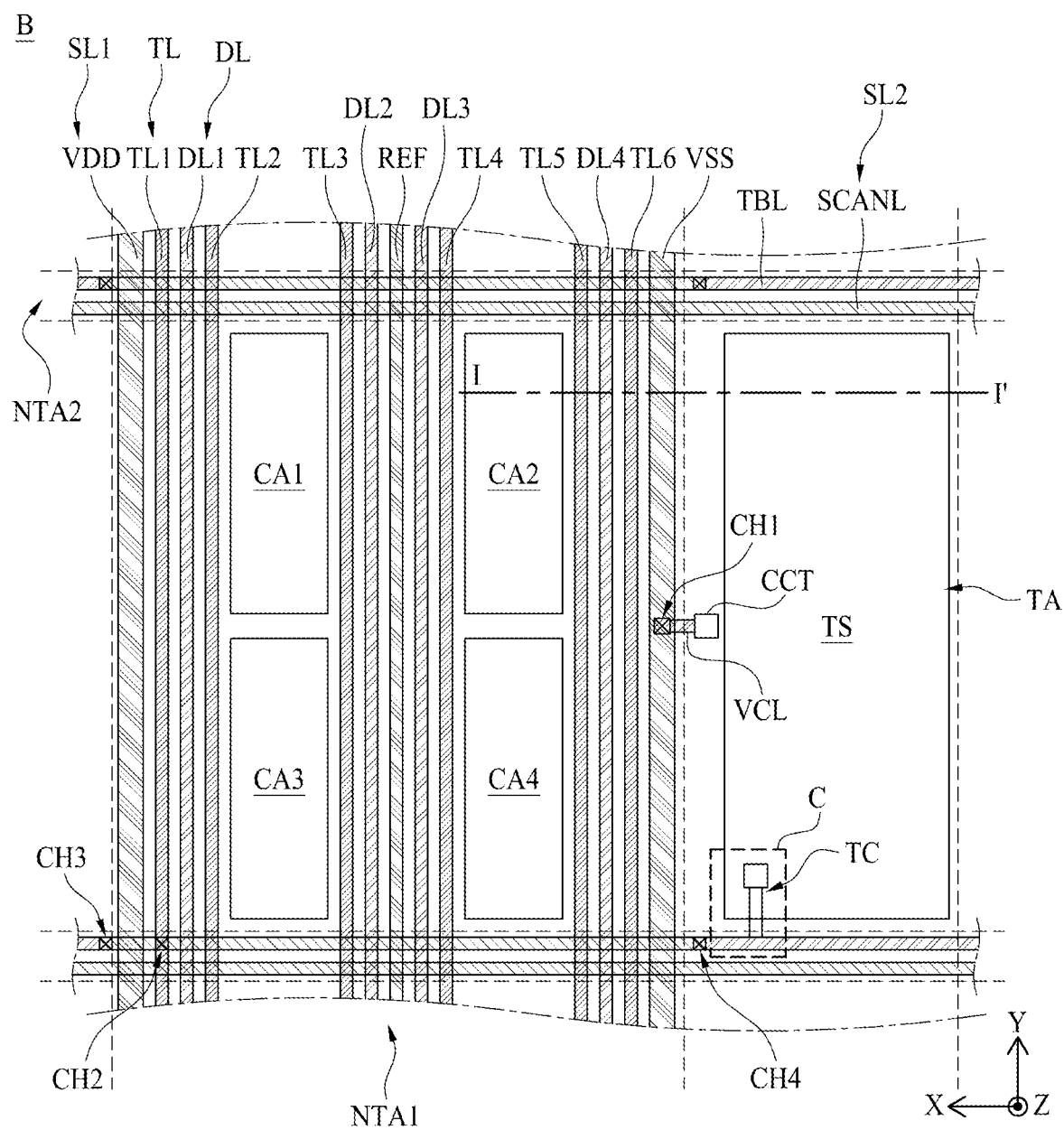
FIG. 3 is a view illustrating an example of signal lines, touch lines and a touch sensor, which are provided in an area B of FIG. 2.

FIG. 2 is a schematic view illustrating an example of a pixel provided in an area A of FIG. 1, and FIG. 3 is a view illustrating an example of signal lines, touch lines and a touch sensor, which are provided in an area B of FIG. 2.

The display area DA, as shown in FIG. 2, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than $\alpha$%, for example, about 90%, and the non-transmissive area NTA may be an area where light transmittance is smaller than $\beta$%, for example, about 50%. At this time, a is greater than β. A user may view an object or background arranged over a rear surface of the transparent display panel 110 due to the transmissive area TA.

The non-transmissive area NTA may include a first non-transmissive area NTA1, a second non-transmissive area NTA2 and a plurality of pixels P.

Pixels P may be provided to at least partially overlap at least one of the first signal line SL1 and the second signal line SL2, thereby emitting predetermined light to display an image. A light emission area EA may correspond to an area, from which light is emitted, in the pixel P.

Each of the pixels P, as shown in FIG. 2, may include at least one of a first subpixel SP1, a second subpixel SP2, a third subpixel SP3 and a fourth subpixel SP4. The first subpixel SP1 may include a first light emission area EA1 emitting light of a first color. The second subpixel SP2 may include a second light emission area EA2 emitting light of a second color. The third subpixel SP3 may include a third light emission area EA3 emitting light of a third color. The fourth subpixel SP4 may include a fourth light emission area EA4 emitting light of a fourth color.

The first to fourth light emission area EA1, EA2, EA3 and EA4 may emit light of different colors. For example, the first light emission area EA1 may emit light of a green color. The second light emission area EA2 may emit light of a red color. The third light emission area EA3 may emit light of a blue color. The fourth light emission area EA4 may emit light of a white color. However, the light emission areas are not limited to this example. Each of the pixels P may further include a subpixel emitting light of a color other than red, green, blue and white. Also, the arrangement order of the subpixels SP1, SP2, SP3 and SP4 may be changed in various ways.

The first non-transmissive area NTA1 may be extended in a first direction (Y-axis direction) in a display area DA, and may be disposed to at least partially overlap light emission areas EA1, EA2, EA3 and EA4. A plurality of first non-transmissive areas NTA1 may be provided in the transparent display panel 110, and a transmissive area TA may be provided between two adjacent first non-transmissive areas NTA1. In the first non-transmissive area NTA1, first signals lines extended in the first direction (Y-axis direction) and touch lines TL extended in the first direction (Y-axis direction) may be disposed to be spaced apart from each other.

For example, the first signal lines SL1 may include at least one of a pixel power line VDD, a common power line VSS, a reference line REF or data lines DL1, DL2, DL3 and DL4.

The pixel power line VDD may supply a first power source to a driving transistor TFT of each of subpixels SP1, SP2, SP3 and SP4 provided in the display area DA.

The common power line VSS may supply a second power source to a cathode electrode CE of the subpixels SP1, SP2, SP3 and SP4 provided in the display area DA. At this time, the second power source may be a common power source commonly supplied to the subpixels SP1, SP2, SP3 and SP4.

The common power line VSS may supply the second power source to the cathode electrode through a cathode contact portion CCT provided between the transmissive area TA and the common power line VSS. A power connection line VCL may be disposed between the common power line VSS and the cathode contact portion CCT. One end of the power connection line VCL may be connected to the common power line VSS and the other end thereof may be connected to the cathode contact portion CCT. The cathode electrode may be connected to the cathode contact portion CCT. As a result, the cathode electrode may be electrically connected to the common power line VSS through the power connection line VCL and the cathode contact portion CCT.

The reference line REF may supply an initialization voltage (or sensing voltage) to the driving transistor TFT of each of the subpixels SP1, SP2, SP3 and SP4 provided in the display area DA.

The reference line REF may be disposed between the plurality of data lines DL1, DL2, DL3 and DL4. For example, the reference line REF may be disposed at the center of the plurality of data lines DL1, DL2, DL3 and DL4, that is, between the second data line DL2 and the third data line DL3.

The reference line REF may be diverged and connected to the plurality of subpixels SP1, SP2, SP3 and SP4. In detail, the reference line REF may be connected to circuit elements of the plurality of subpixels SP1, SP2, SP3 and SP4 to supply an initialization voltage (or sensing voltage) to each of the subpixels SP1, SP2, SP3 and SP4.

When the reference line REF is disposed to be close to an edge of the first non-transmissive area NTA1, a deviation between connection lengths from the diverged point to the circuit element of each of the plurality of subpixels SP1, SP2, SP3 and SP4 is increased. For example, when the reference line REF is disposed at the leftmost side of the area where the first non-transmissive area NTA1 is provided, the connection length from the diverged point to the circuit element disposed over a right side of the first non-transmissive area NTA1 may be greater than the connection length from the diverged point to the circuit element disposed over a left side of the first non-transmissive area NTA1. In this case, a difference between the signal supplied to the circuit area disposed over the right side of the first non-transmissive area NTA1 and the signal supplied to the circuit area disposed over the left side of the first non-transmissive area NTA1 may occur.

In the transparent display panel 110 according to one embodiment of the present disclosure, the reference line REF may be disposed in a middle area of the first non-transmissive area NTA1, whereby the deviation between the connection lengths to the circuit elements of the respective subpixels SP1, SP2, SP3 and SP4 may be reduced or minimized. Therefore, the reference line REF may uniformly supply signals to the circuit element of each of the plurality of subpixels SP1, SP2, SP3 and SP4.

Each of the data lines DL1, DL2, DL3 and DL4 may supply a data voltage to the subpixels SP1, SP2, SP3 and SP4. For example, the first data line DL1 may supply a first data voltage to the first driving transistor TFT of the first subpixel SP1, the second data line DL2 may supply a second data voltage to the second driving transistor TFT of the second subpixel SP2, the third data line DL3 may supply a third data voltage to the third driving transistor TFT of the third subpixel SP3, and the fourth data line DL4 may supply a fourth data voltage to the fourth driving transistor TFT of the fourth subpixel SP4.

In the transparent display panel 110 according to one embodiment of the present disclosure, the touch line TL may be further disposed in the first non-transmissive area NTA1.

At least two touch lines TL may be provided in the first non-transmissive area NTA1. When the plurality of touch lines TL are disposed in the transmissive area TA of the transparent display panel 110, light transmittance may be deteriorated due to the plurality of touch lines TL.

Also, a slit, specifically an elongated linear or rectangular shape, may be provided between the plurality of touch lines TL. When external light passes through the slit, a diffraction phenomenon may occur. According to the diffraction phenomenon, light corresponding to plane waves may be changed to spherical waves as the light passes through the slit, and an interference phenomenon may occur in the spherical waves. Therefore, constructive interference and destructive interference occur in the spherical waves, whereby the external light that has passed through the slit may have irregular light intensity. As a result, in the transparent display panel 110, definition of an object or image positioned at an opposite side may be reduced. For this reason, there is some technical benefits to dispose the plurality of touch lines TL in the first non-transmissive area NTA1 rather than the transmissive area TA.

A plurality of touch lines TL may be disposed between first signal lines SL1 in a first non-transmissive area NTA1 as shown in FIG. 3. For example, six touch lines TL1, TL2, TL3, TL4, TL5 and TL6 may be disposed in one first non-transmissive area NTA1. Each of the six touch lines TL1, TL2, TL3, TL4, TL5 and TL6 may be disposed between the first signal lines SL1 disposed in the order of a pixel power line VDD, a first data line DL1, a second data line DL2, a reference line REF, a third data line DL3, a fourth data line DL4 and a common power line VSS, but are not limited to this arrangement.

The plurality of touch lines TL are required so as not to overlap circuit areas CA1, CA2, CA3 and CA4 in which circuit elements are disposed, and various modifications may be made in the arrangement order of the plurality of touch lines TL with the first signal lines SL1. In another embodiment, the plurality of touch lines TL may be disposed between the first signal lines SL1 and a transmissive area TA. The three touch lines TL1, TL2 and TL3 may be disposed between the pixel power line VDD and the transmissive area TA, and the other three touch lines TL4, TL5 and TL6 may be disposed between the common power line VSS and the transmissive area TA.

The transparent display panel 110 according to one embodiment of the present disclosure includes a pixel P between adjacent transmissive areas TA, and the pixel P may include light emission areas EA1, EA2, EA3 and EA4 in which a light emitting element is disposed to emit light. Since a size of the non-transmissive area NTA is small in the transparent display panel 110, the circuit element may be disposed to at least partially overlap the light emission areas EA1, EA2, EA3 and EA4. That is, the light emission areas EA1, EA2, EA3 and EA4 may include circuit areas CA1, CA2, CA3 and CA4 in which the circuit elements are disposed.

For example, the circuit areas may include a first circuit area CA1 in which a circuit element connected to the first subpixel SP1 is disposed, a second circuit area CA2 in which a circuit element connected to the second subpixel SP2 is disposed, a third circuit area CA3 in which a circuit element connected to the third subpixel SP3 is disposed, and a fourth circuit area CA4 in which a circuit element connected to the fourth subpixel SP4 is disposed.

In the transparent display panel 110 according to one embodiment of the present disclosure, the plurality of touch lines TL do not overlap the circuit areas CA1, CA2, CA3 and CA4, whereby parasitic capacitance of the touch lines TL due to the circuit elements may be reduced or minimized.

Furthermore, the transparent display panel 110 according to one embodiment of the present disclosure may reduce a horizontal distance difference between the touch lines TL. Since at least two transistors and a capacitor are disposed in the circuit areas CA1, CA2, CA3 and CA4, the touch lines TL may be difficult to be formed in a straight line in the circuit areas CA1, CA2, CA3, and CA4, and may be difficult to have a constant horizontal distance. Therefore, the horizontal distance difference between the touch lines TL is increased, whereby uniformity of the parasitic capacitance may be very low.

In the transparent display panel 110 according to one embodiment of the present disclosure, the touch lines TL may be disposed so as not to overlap the circuit areas CA1, CA2, CA3 and CA4, whereby an influence of the circuit element may be reduced and at the same time the horizontal distance difference between the touch lines TL may be reduced to improve uniformity of the parasitic capacitance.

The second non-transmissive area NTA2 may be extended in the display area DA in a second direction (X-axis direction), and may be disposed to at least partially overlap the light emission areas EA1, EA2, EA3 and EA4. A plurality of second non-transmissive areas NTA2 may be provided in the transparent display panel 110, and the transmissive area TA may be provided between two adjacent second non-transmissive areas NTA2. The second signal line SL2 and a touch bridge line TBL may be disposed to be spaced apart from each other in the second non-transmissive area NTA2.

The second signal line SL2 may be extended in the second direction (X-axis direction), and may include, for example, a scan line SCANL. The scan line SCANL may supply a scan signal to the subpixels SP1, SP2, SP3 and SP4 of the pixel P.

Figure 5:
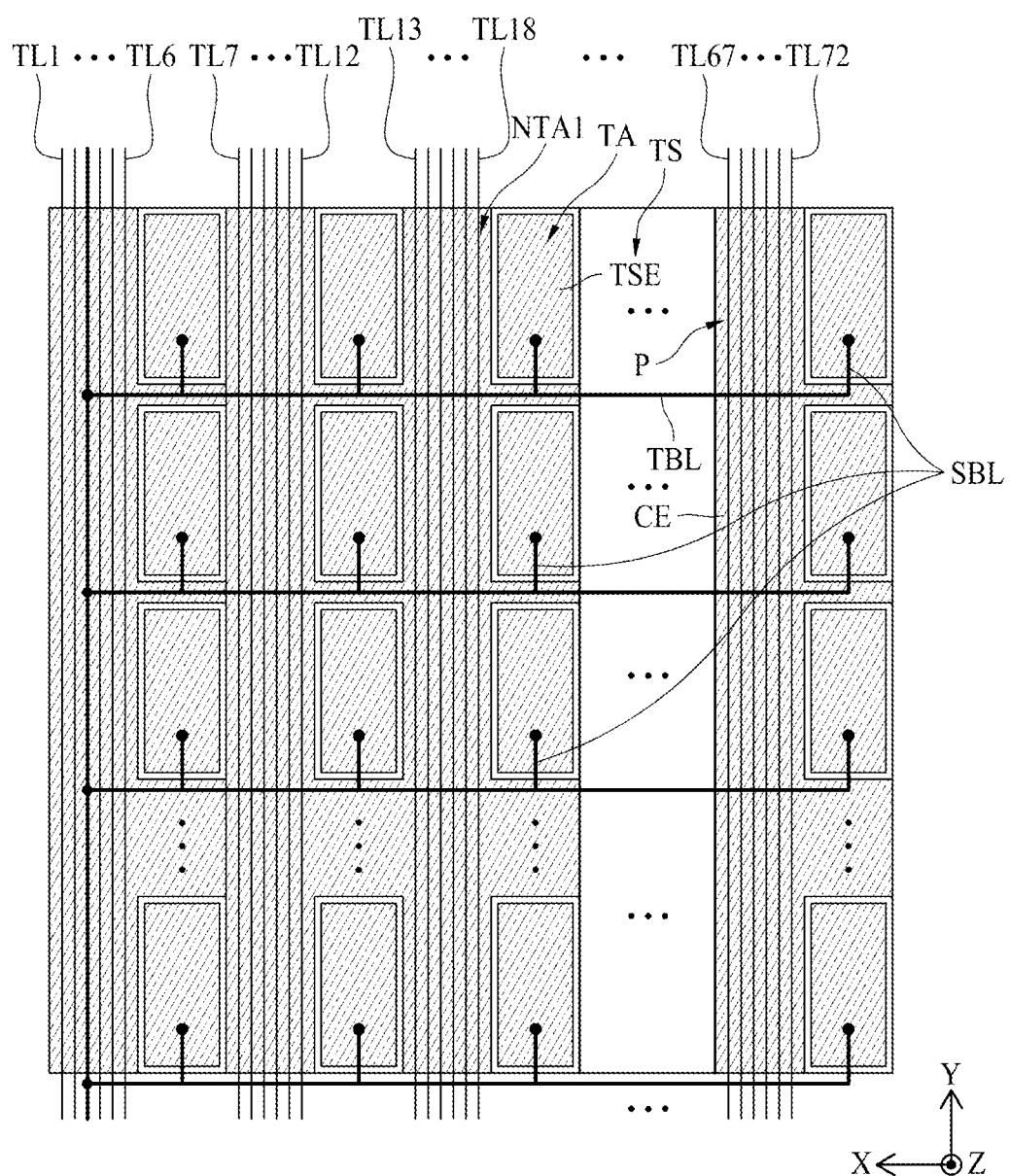
FIG. 5 is a view illustrating a connection relation between a plurality of touch sensors and a plurality of touch lines in one touch block.

A touch bridge line TBL may connect any one of the plurality of touch lines TL with a touch sensor TS. As shown in FIG. 5, the touch bridge line TBL extending in the X-axis direction may include a sub bridge line SBL extending in the Y-axis direction to connect with a touch sensor TS. The sub bridge line SBL of the touch bridge line TBL may be connected to any one of the plurality of touch lines TL through a second contact hole CH2. Further, the sub bridge line SBL of the touch bridge line TBL may be connected to at least two touch sensors TS extended in a second direction (X-axis direction) and arranged in the second direction (X-axis direction).

In one embodiment, the touch bridge line TBL may include a plurality of layers, e.g., two layers. The touch bridge line TBL may include a first touch bridge line disposed in the first layer in an area overlapped with the first non-transmissive area NTA1 and a second touch bridge line disposed in the second layer in an area that is not overlapped with the first non-transmissive area NTA1. One first touch bridge line may be connected to one second touch bridge line through a third contact hole CH3 at one end, and may be connected to another second touch bridge line through a fourth contact hole CH4 at the other end. For example, the first layer may be the same layer as a gate electrode of a driving transistor, and the second layer may be the same layer as a source electrode and a drain electrode of the driving transistor.

In the transparent display panel 110 according to one embodiment of the present disclosure, the plurality of touch lines TL may be disposed in the first non-transmissive area NTA1 not the second non-transmissive area NTA2, whereby light transmittance may be prevented from being deteriorated due to the plurality of touch lines TL. The second non-transmissive area NTA2 extended in the second direction (X-axis direction) crosses between the transmissive areas TA adjacent to each other as shown in FIG. 3. When a width of the second non-transmissive area NTA2 crossing the transmissive areas TA is increased, the size of the transmissive area TA may be reduced.

When the plurality of touch lines TL are disposed in the second non-transmissive area NTA2, the width of the second non-transmissive area NTA2 is increased to dispose a large number of lines, and the size of the transmissive area TA is reduced. That is, a problem may occur in that light transmittance of the transparent display panel 110 is reduced due to the plurality of touch lines TL.

In the transparent display panel 110 according to one embodiment of the present disclosure, the plurality of touch lines TL are disposed in the first non-transmissive area NTA1, and only one touch bridge line TBL for connecting the plurality of touch sensors TS is provided in the second non-transmissive area NTA2. Therefore, the transparent display panel 110 according to one embodiment of the present disclosure may reduce or minimize decrease in the size of the transmissive area TA or decrease of light transmittance due to the plurality of touch lines TL and the touch bridge line TBL.

The touch sensor TS may be provided in the transmissive area TA. The touch sensor TS may be disposed in each of the plurality of transmissive areas TA, and may be changed in capacitance during user contact. A touch driver (not shown) may be connected to the plurality of touch sensors TS through the plurality of touch lines TL to detect a change in capacitance of the plurality of touch sensors TS.

Hereinafter, a connection relation between the plurality of touch sensors TS, the plurality of touch lines TL and the plurality of touch bridge lines TBL will be described in more detail with reference to FIGS. 4 and 5.

Figure 4:
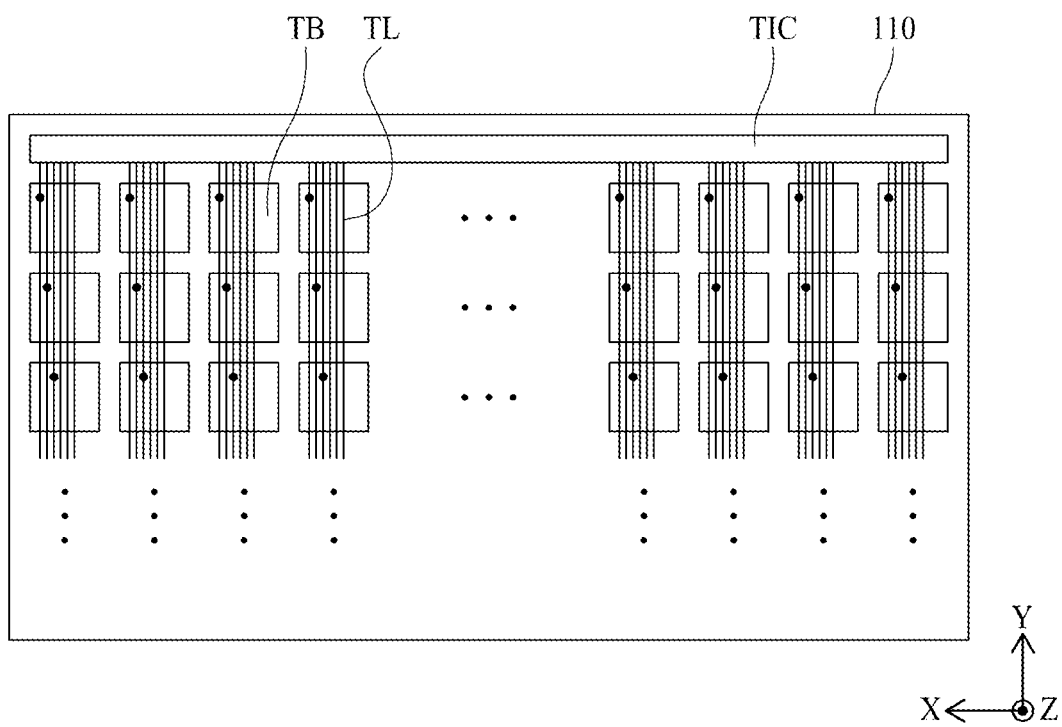
FIG. 4 is a view illustrating a connection relation between a plurality of touch blocks and a plurality of touch lines.

FIG. 4 is a view illustrating a connection relation between a plurality of touch blocks and a plurality of touch lines, and FIG. 5 is a view illustrating a connection relation between a plurality of touch sensors and a plurality of touch lines in one touch block.

Referring to FIGS. 4 to 5, the transparent display panel 110 according to one embodiment of the present disclosure may include a plurality of touch blocks TB. Each of the plurality of touch blocks TB may include a plurality of pixels P and a plurality of transmissive areas TA disposed to correspond to the plurality of pixels P one-to-one as a basic unit for determining a user touch position.

As shown in FIG. 5, the transparent display panel 110 according to one embodiment of the present disclosure may include a touch sensor TS in the transmissive area TA. For example, each of the plurality of touch blocks TB may include 12×15 pixels P and 12×15 touch sensors TS. In this case, when image resolution is 1920×1080, touch resolution may be 160×72.

At this time, the touch sensor TS may include a touch sensor electrode TSE. The touch sensor electrode TSE may include the same material in the same layer as the cathode electrode CE of the pixel P. In this case, the touch sensor electrode TSE and the cathode electrode CE may be disposed to be spaced apart from each other.

In the transparent display panel 110 according to one embodiment of the present disclosure, as each of the plurality of touch lines TL is connected to one of the plurality of touch blocks TB, a change in capacitance of the touch sensors TS provided in the connected touch block TB may be sensed. That is, the plurality of touch lines TL provided in the transparent display panel 110 may correspond to the plurality of touch blocks TB one-to-one. Therefore, the number of touch lines TL may be the same as the number of touch blocks TB in the transparent display panel 110. For example, when the number of touch blocks TB is 160×72, the touch line TL may also be 160×72, and may be connected to the touch driver TIC.

As described above, in order to form the touch lines TL as much as the number of touch blocks TB, at least two touch lines TL should be provided in one first non-transmissive area NTA1. For example, when image resolution is 1920×1080 and touch resolution is 160×72, six touch lines TL1, TL2, TL3, TL4, TL5 and TL6 may be provided in one first non-transmissive area NTA1, as shown in FIG. 3, in order to form 160×72 touch lines TL in the transparent display panel 110.

The plurality of touch sensors TS provided in one touch block TB may be connected to one of the plurality of touch lines TL provided in one touch block TB as shown in FIG. 5. For example, twelve first non-transmissive areas NTA1 may be provided in one touch block TB, and six touch lines TL1, TL2, TL3, TL4, TL5 and TL6 may be disposed in each of the twelve first non-transmissive areas NTA1. As a result, one touch block TB may be provided with 72 touch lines TL1, . . . , TL72. In this case, the plurality of touch sensors TS provided in one touch block TB may be connected to one specific touch line TL of the 72 touch lines TL1, . . . , TL72. At this time, the specific touch line TL may be connected to the plurality of touch sensors TS arranged in the second direction (X-axis direction) through the touch bridge lines TBL extended in the second direction (X-axis direction). As a result, the plurality of touch sensors TS provided in one touch block TB may be electrically connected through a specific touch line TL and the touch bridge lines TBL.

Each of the plurality of touch lines TL may correspond to the touch blocks TB one-to-one. Each touch line TL connects the plurality of touch sensors TS provided in a corresponding touch block TB to the touch driver TIC. In detail, each touch line TL may transfer the changed capacitance provided from the touch sensors TS provided in the touch block TB to the touch driver TIC. The touch driver TIC may sense the change in capacitance, and may determine a touch position of a user. Further, each touch line TL may provide a sensing voltage generated from the touch driver TIC to the touch sensors TS provided in the touch block TB.

Hereinafter, light emitting elements of a light emission area EA, the touch sensors TS of the transmissive area TA, and the connection relation between the touch sensors TS and the touch bridge line TBL will be described in more detail with reference to FIGS. 6 to 11.

Figure 6:
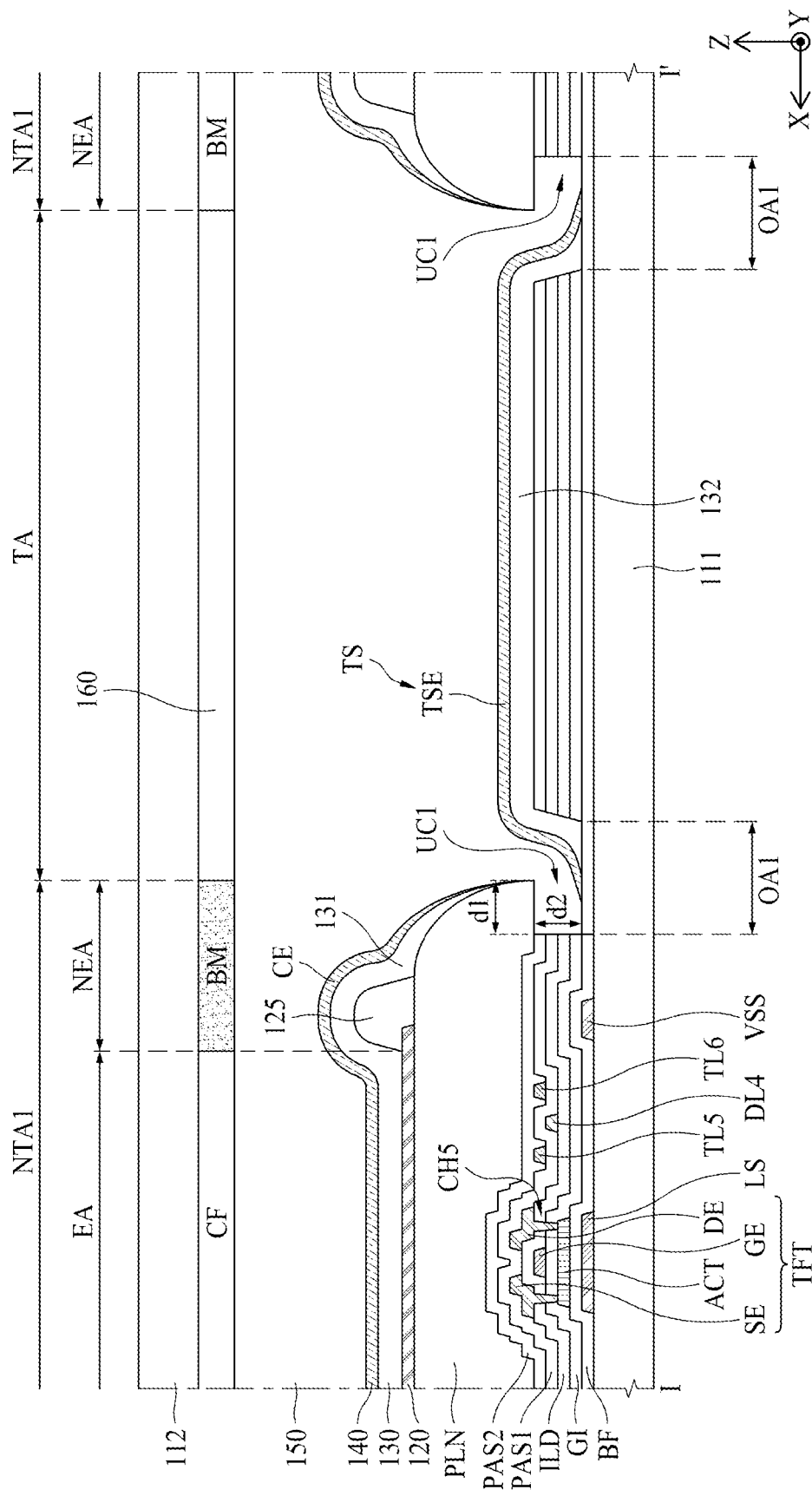
FIG. 6 is a cross-sectional view taken along line I-I' of FIG. 3.
Figure 7:
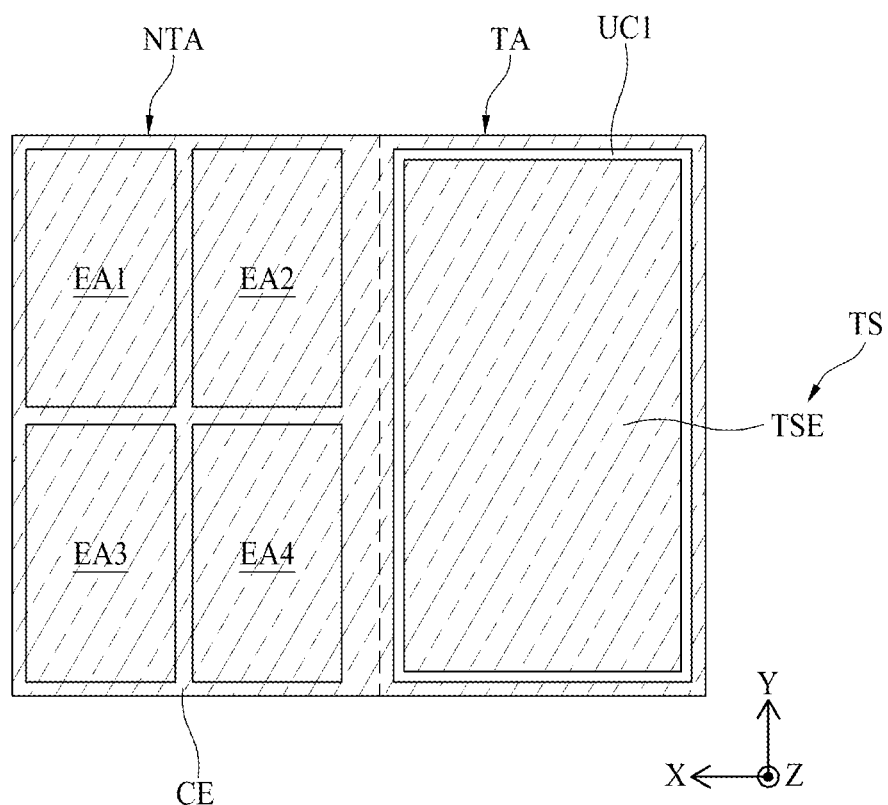
FIG. 7 is a view illustrating an example that a cathode electrode and a touch sensor electrode are disposed.
Figure 8:
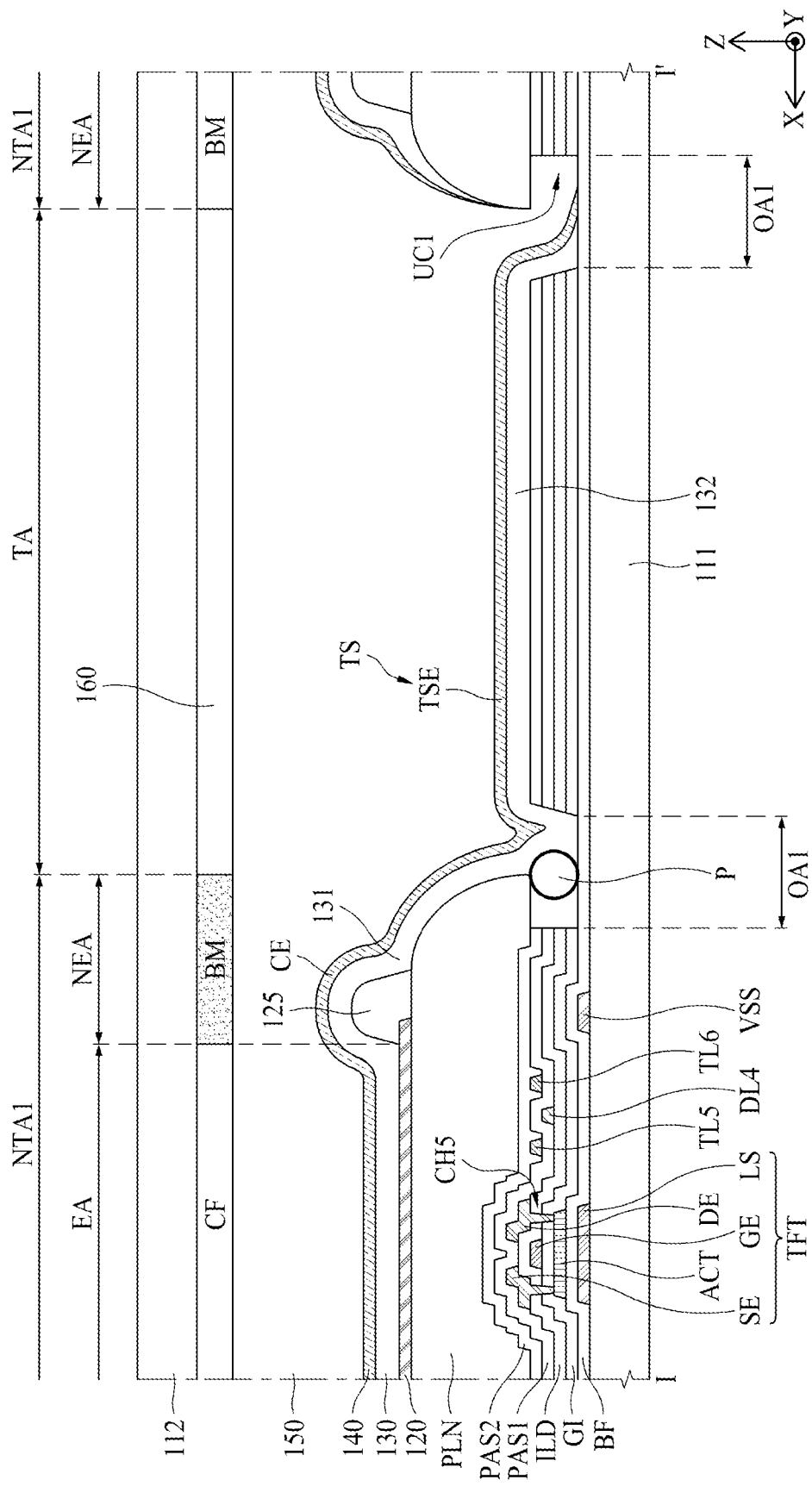
FIG. 8 is a view illustrating an example that particles enter in a first undercut structure to cause a defective touch sensor.

FIG. 6 is a cross-sectional view taken along line I-I' of FIG. 3, FIG. 7 is a view illustrating an example that a cathode electrode and a touch sensor electrode are disposed, and FIG. 8 is a view illustrating an example that particles enter a first undercut structure to cause a defective touch sensor.

Referring to FIGS. 6 to 8, the first non-transmissive area NTA1 may include circuit areas CA1, CA2, CA3 and CA4 in which at least one transistor and a capacitor are disposed, and a pixel power line VDD, a common power line VSS, a reference line REF, data lines DL and touch lines TL, which are extended in a first direction (Y-axis direction) and disposed so as not to overlap the circuit areas CA1, CA2, CA3 and CA4. A second non-transmissive area NTA2 may include a scan line SCANL and a touch bridge line TBL, which are extended in the second direction (X-axis direction).

The at least one transistor may include a driving transistor TFT, a switching transistor, and a sensing transistor.

The switching transistor is switched in accordance with a scan signal supplied to the scan line SCANL to charge a data voltage supplied from the data line DL in the capacitor. The sensing transistor serves to sense a threshold voltage deviation of the driving transistor TFT, which causes degradation of image quality, in accordance with a sensing signal.

The driving transistor TFT is switched in accordance with the data voltage charged in the capacitor to generate a data current from a power source supplied from the pixel power line VDD and supply the data current to a first electrode 120 of subpixels SP1, SP2, SP3 and SP4. The driving transistor TFT may include an active layer ACT, a gate electrode GE, a source electrode SE, and a drain electrode DE.

In detail, as shown in FIG. 6, a light shielding layer LS may be provided over a first substrate 111. The light shielding layer LS may shield external light incident over the active layer ACT in an area in which the driving transistor TFT is provided. The light shielding layer LS may include a single layer or multi-layer made of any one of molybdenum (Mo), aluminum (Al), chromium (Cr), gold (Au), titanium (Ti), nickel (Ni), neodymium (Nd) and copper (Cu), or their alloy.

A transparent display panel 110 according to one embodiment of the present disclosure may form at least a portion of the pixel power line VDD, the common power line VSS, the reference line REF, the data lines DL and the touch lines TL in the same layer as the light shielding layer LS. For example, the common power line VSS may include the same material as that of the light shielding layer LS in the same layer as the light shielding layer LS, but is not limited thereto.

In the transparent display panel 110 according to one embodiment of the present disclosure, signal lines provided over the same layer as the light shielding layer LS may be varied depending on the arrangement order of the pixel power line VDD, the common power line VSS, the reference line REF, the data lines DL and the touch lines TL. However, in the transparent display panel 110 according to one embodiment of the present disclosure, two signal lines disposed to be adjacent to each other may not be disposed over the same layer as the light shielding layer LS. That is, one of the two adjacent signal lines may be disposed over the same layer as the light shielding layer LS, and the other one of the two adjacent signal lines may be disposed over a different layer from the light shielding layer LS, for example, the same layer as a gate electrode GE or a source electrode SE and a drain electrode DE. Therefore, the transparent display panel 110 according to one embodiment of the present disclosure may make sure of a gap distance between the signal lines.

A buffer layer BF may be provided over the light shielding layer LS and the common power line VSS. The buffer layer BF is to protect the transistors TFT from water permeated through the first substrate 111 vulnerable to water permeation, and may include an inorganic layer, for example, a silicon oxide layer (SiOx), a silicon nitride layer (SiNx) or a multi-layer of the silicon oxide layer and the silicon nitride layer.

An active layer ACT may be provided over the buffer layer BF. The active layer ACT may include a silicon-based semiconductor material or an oxide-based semiconductor material.

A gate insulating layer GI may be provided over the active layer ACT. The gate insulating layer GI may be provided in the non-transmissive area NTA and the transmissive area TA. However, in order to form a first undercut structure UC1 in the transmissive area TA, a first opening area OA1, which exposes the buffer layer BF without being provided in at least a portion of the transmissive area TA, may be provided. The gate insulating layer GI may include an inorganic layer, for example, a silicon oxide layer (SiOx), a silicon nitride layer (SiNx) or a multi-layer of the silicon oxide layer and the silicon nitride layer.

A gate electrode GE may be provided over the gate insulating layer GI. The gate electrode GE may include a single layer or multi-layer made of one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may be provided in the non-transmissive area NTA and the transmissive area TA. However, the interlayer dielectric layer ILD may be provided with a first opening area OA1, which exposes the buffer layer BF without being provided in at least a portion of the transmissive area TA, to form the first undercut structure UC1 in the transmissive area TA. The first opening area OA1 of the interlayer dielectric layer ILD may at least partially overlap the first opening area OA1 of the gate insulating layer GI. The interlayer dielectric layer ILD may include an inorganic layer, for example, a silicon oxide layer (SiOx), a silicon nitride layer (SiNx) or a multi-layer of the silicon oxide layer and the silicon nitride layer.

The source electrode SE and the drain electrode DE may be provided over the interlayer dielectric layer ILD. The source electrode SE and the drain electrode DE may be connected to the active layer ACT through a fifth contact hole CH5 passing through the gate insulating layer GI and the interlayer dielectric layer ILD. The source electrode SE and the drain electrode DE may include a single layer or multi-layer made of one of molybdenum (Mo), aluminum (Al), chromium (Cr), gold (Au), titanium (Ti), nickel (Ni), neodymium (Nd) and copper (Cu), or their alloy.

In the transparent display panel 110 according to one embodiment of the present disclosure, at least a portion of the pixel power line VDD, the common power line VSS, the reference line REF, the data lines DL and the touch lines TL may be provided in the same layer as the source electrode SE and the drain electrode DE. For example, a portion of the data lines DL may include the same material as that of the source electrode SE and the drain electrode DE in the same layer as the source electrode SE and the drain electrode DE, but is not limited thereto.

A first passivation layer PAS1 for insulating the driving transistor TFT may be provided over the source electrode SE and the drain electrode DE, and a second passivation layer PAS2 may be provided over the first passivation layer PAS1.

The first and second passivation layers PAS1 and PAS2 may be provided in the non-transmissive area NTA and the transmissive area TA. However, the first and second passivation layers PAS1 and PAS2 may be provided with a first opening area OA1, which exposes the buffer layer BF without being provided in at least a portion of the transmissive area TA, to form the first undercut structure UC1 in the transmissive area TA. The first opening area OA1 of the first and second passivation layers PAS1 and PAS2 may at least partially overlap the first opening area OA1 of the interlayer dielectric layer ILD and the first opening area OA1 of the gate insulating layer GI.

The first and second passivation layers PAS1 and PAS2 may include an inorganic layer, for example, a silicon oxide layer (SiOx), a silicon nitride layer (SiNx) or a multi-layer of the silicon oxide layer and the silicon nitride layer.

Meanwhile, in the transparent display panel 110 according to one embodiment of the present disclosure, at least a portion of the pixel power line VDD, the common power line VSS, the reference line REF, the data lines DL and the touch lines TL may be provided between the first passivation layer PAS1 and the second passivation layer PAS2. For example, some TL5 and TL6 of the plurality of touch lines TL may be provided between the first passivation layer PAS1 and the second passivation layer PAS2, but are not limited thereto.

A planarization layer PLN may be provided over the second passivation layer PAS2 to planarize a step difference due to the driving transistor TFT and the plurality of signal lines. The planarization layer PLN may be provided in the non-transmissive area NTA, and may not be provided in at least a portion of the transmissive area TA to form the first undercut structure UC1 in the transmissive area TA.

The planarization layer PLN may include an organic layer such as an acrylic resin, an epoxy resin, a phenolic resin, a polyamide resin and a polyimide resin.

In the transparent display panel 110 according to one embodiment of the present disclosure, the first undercut structure UC1 may be formed using the planarization layer PLN and the plurality of inorganic insulating layers, for example, first and second passivation layers PAS1 and PAS2, the interlayer dielectric layer ILD and the gate insulating layer GI. In detail, the first undercut structure UC1 may be formed in such a manner that the planarization layer PLN is more protruded than the plurality of inorganic insulating layers, for example, the first and second passivation layers PAS1 and PAS2, the interlayer dielectric layer ILD and the gate insulating layer GI in a direction of the transmissive area TA. Therefore, the first undercut structure UC1 may expose at least a portion of a lower surface of the planarization layer PLN, and the plurality of inorganic insulating layers may not be provided below the exposed lower surface so that a gap space with the buffer layer BF may be formed.

The first undercut structure UC1 may be formed through a wet etching process. The wet etching process for forming the first undercut structure UC1 may be isotropic etching. Therefore, in the first undercut structure UC1, a first spaced distance d1 from an end of the planarization layer PLN to an end of the plurality of inorganic insulating layers may be the same as a second spaced distance d2 from a lower surface of the planarization layer PLN to an upper surface of the buffer layer BF. At this time, the first spaced distance d1 of the first undercut structure UC1 should have a minimum distance value, for example, 2 um or more in order to ensure separation of the cathode electrode CE and the touch sensor electrode TSE. Therefore, since the second spaced distance d2 of the first undercut structure UC1 should be greater than or equal to 2 um, a sum of thicknesses of the first and second passivation layers PAS1 and PAS2, the interlayer dielectric layer ILD and the gate insulating layer GI may be greater than or equal to 2 um.

The first undercut structure UC1 may be provided in the transmissive area TA, and may have a planar closed shape. For example, the first undercut structure UC1 may be provided along the along the edge of the transmissive area TA, as shown in FIG. 7. The first undercut structure UC1 may be provided to surround the touch sensor TS.

In the transparent display panel 110 according to one embodiment of the present disclosure, the first undercut structure UC1 may be formed using the planarization layer PLN and the plurality of inorganic insulating layers, whereby light transmittance may be prevented from being reduced due to the first undercut structure UC1.

The first undercut structure UC1 may be formed using a separate metal pattern more protruded toward the transmissive area TA than the plurality of inorganic insulating layers. The metal pattern may include the same material as that of first electrode 120 in the same layer as the first electrode 120, and may be disposed to be spaced apart from the first electrode 120. In this case, since the metal pattern is made of an opaque metal material, an area, in which the metal pattern is provided, cannot be the transmissive area TA, and may be the non-transmissive area NTA. That is, since the first undercut structure UC1 reduces light transmittance, it is not preferable.

A light emitting element, which includes a first electrode 120, an organic light emitting layer 130 and a second electrode 140, and a bank 125 may be provided over the planarization layer PLN.

The first electrode 120 may be provided over the planarization layer PLN for each of the subpixels SP1, SP2, SP3 and SP4. The first electrode 120 is not provided in the transmissive area TA.

The first electrode 120 may be connected to the driving transistor TFT. In detail, the first electrode 120 may be connected to one of the source electrode SE and the drain electrode DE of the driving transistor TFT through a contact hole (not shown) that passes through the planarization layer PLN and the first and second passivation layers PAS1 and PAS2.

The first electrode 120 may include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti). The first electrode 120 may be an anode electrode.

The bank 125 may be provided over the planarization layer PLN. The bank 125 may be provided to at least partially cover an edge of the first electrode 120 and expose a portion of the first electrode 120. Therefore, the bank 125 may prevent a problem in which light emitting efficiency is deteriorated due to concentration of a current on an end of the first electrode 120.

The bank 125 may define light emission areas EA1, EA2, EA3 and EA4 of the subpixels SP1, SP2, SP3 and SP4. The light emission areas EA1, EA2, EA3 and EA4 of each of the subpixels SP1, SP2, SP3 and SP4 represent an area in which the first electrode 120, the organic light emitting layer 130 and the cathode electrode CE are sequentially stacked and holes from the first electrode 120 and electrons from the cathode electrode CE are combined with each other in the organic light emitting layer 130 to emit light. In this case, the area in which the bank 125 is provided may become the non-light emission area NEA because light is not emitted therefrom, and the area in which the bank 125 is not provided and the first electrode is exposed may become the light emission area EA.

The bank 125 may include an organic layer such as an acrylic resin, an epoxy resin, a phenolic resin, a polyimide resin, and a polyimide resin.

The organic light emitting layer 130 may be disposed over the first electrode 120. The organic light emitting layer 130 may include a hole transporting layer, a light emitting layer and an electron transporting layer. In this case, when a voltage is applied to the first electrode 120 and the cathode electrode CE, holes and electrons move to the light emitting layer through the hole transporting layer and the electron transporting layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, the light emitting layer of the organic light emitting layer 130 may be provided for each of the subpixels SP1, SP2, SP3 and SP4. For example, a green light emitting layer for emitting green light may be provided in the first subpixel SP1, a red light emitting layer for emitting red light may be provided in the second subpixel SP2, a blue light emitting layer for emitting blue light may be provided in the third subpixel SP3, and a white light emitting layer for emitting white light may be provided in the fourth subpixel SP4. In this case, the light emitting layer of the organic light emitting layer 130 is not provided in the transmissive area TA.

The organic light emitting layer 130 may be separated without being continuous between the non-transmissive area NTA and the transmissive area TA by the first undercut structure UC1. In detail, an organic light emitting layer 131 of the organic light emitting layer 130, which is provided in the non-transmissive area NTA, and an organic light emitting layer 132 of the organic light emitting layer 130, which is provided in the transmissive area TA, may be separated from each other by the first undercut structure UC1. That is, the organic light emitting layer 131 of the organic light emitting layer 130, which is provided in the non-transmissive area NTA, and the organic light emitting layer 132 of the organic light emitting layer 130, which is provided in the transmissive area TA, may be spaced apart from each other by the first undercut structure UC1.

The second electrode 140 may be disposed over the organic light emitting layer 130 and the bank 125. When the second electrode 140 is deposited over the entire surface, the second electrode 140 may be separated without being continuous between the non-transmissive area NTA and the transmissive area TA by the first undercut structure UC1. In detail, the second electrode 140 may be divided into the second electrode CE provided in the non-transmissive area NTA and the second electrode TSE provided in the transmissive area TA by the first undercut structure UC1.

The second electrode CE provided in the non-transmissive area NTA may be the cathode electrode CE, and may be an element constituting the light emitting element. The cathode electrode CE may be connected to the cathode contact portion CCT exposed by the second undercut structure UC2 to receive the power source from the common power line VSS. The cathode electrode CE may be a common layer that is commonly provided in the subpixels SP1, SP2, SP3 and SP4 to apply the same voltage to the subpixels.

The second electrode TSE provided in the transmissive area TA may be the touch sensor electrode TSE, and may be an element constituting the touch sensor TS. The touch sensor electrode TSE may be connected to a touch contact electrode TCT exposed by the second undercut structure UC2 to provide a change in capacitance to the touch line TL.

The second electrode 140, which includes the cathode electrode CE and the touch sensor electrode TSE, may include a transparent conductive material (TCO) such as ITO and IZO, which may transmit light, or a semi-transmissive conductive material such as magnesium (Mg), silver (Ag) or an alloy of magnesium (Mg) and silver (Ag). When the second electrode 140 includes a semi-transmissive conductive material, light emitting efficiency may be increased by a micro cavity.

An encapsulation layer 150 may be provided over the light emitting elements and the touch sensors TS. The encapsulation layer 150 may be provided over the cathode electrode CE and the touch sensor electrode TSE to at least partially cover the cathode electrode CE and the touch sensor electrode TSE.

The encapsulation layer 150 serves to prevent oxygen or water from being permeated into the organic light emitting layer 130, the cathode electrode CE and the touch sensor electrode TSE. Accordingly, in some embodiments, the encapsulation layer 150 may include at least one inorganic layer and at least one organic layer.

Meanwhile, although not shown in FIG. 6 and FIG. 8, a capping layer may additionally be provided between the second electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels SP1, SP2, SP3 and SP4. In detail, the color filter CF may include a first color filter, a second color filter, and a third color filter. The first color filter may be disposed to correspond to the light emission area EA1 of the first subpixel SP1, and may be a green color filter that transmits green light. The second color filter may be disposed to correspond to the light emission area EA2 of the second subpixel SP2, and may be a red color filter that transmits red light. The third color filter may be disposed to correspond to the light emission area EA3 of the third subpixel SP3, and may be a blue color filter that transmits blue light.

A black matrix BM may be provided between color filters CF. The black matrix BM may be disposed between the subpixels SP1, SP2, SP3 and SP4 to prevent a color mixture from occurring between adjacent subpixels SP1, SP2, SP3 and SP4. In addition, the black matrix BM may prevent light incident from the outside from being reflected by the plurality of lines provided between the subpixels SP1, SP2, SP3 and SP4.

In the transparent display panel 110 according to one embodiment of the present disclosure, a touch sensor electrode TSE of the touch sensor TS and a cathode electrode CE of the light emitting element may be formed in the same layer by the first undercut structure UC1. The transparent display panel 110 according to one embodiment of the present disclosure has a simple touch process, and does not need to add a separate mask for the touch sensor electrode TSE.

Also, in the transparent display panel 110 according to one embodiment of the present disclosure, the first undercut structure UC1 may be formed using the planarization layer PLN and the plurality of inorganic insulating layers without loss of light transmittance.

Also, in the transparent display panel 110 according to one embodiment of the present disclosure, the touch lines TL may be disposed below the light emitting element, whereby light emitting efficiency of the pixel P may be prevented from being deteriorated due to the touch lines TL.

Also, in the transparent display panel 110 according to one embodiment of the present disclosure, the touch lines TL may be disposed so as not to overlap the circuit areas CA1, CA2, CA3 and CA4, whereby influence due to the circuit elements may be reduced or minimized and at the same time uniformity of parasitic capacitance may be improved.

Also, in the transparent display panel 110 according to one embodiment of the present disclosure, the plurality of touch lines TL may be disposed in the first non-transmissive area NTA1, and only one touch bridge line TBL for connecting the plurality of touch sensors TS may be provided in the second non-transmissive area NTA2, whereby a decrease in a size of the transmissive area TA or light transmittance due to the plurality of touch lines TL and the touch bridge line TBL may be reduced or minimized.

As described above, in the transparent display panel 110 according to one embodiment of the present disclosure, the touch sensor electrode TSE of the touch sensor TS and the cathode electrode CE of the light emitting element may be separated from each other by the first undercut structure UC1. However, in the manufacturing process, particles PRT may occur in the first undercut structure UC1 as shown in FIG. 8. In this case, the touch sensor electrode TSE of the touch sensor TS and the cathode electrode CE of the light emitting element may be electrically connected to each other without being separated from each other.

Since all of the touch sensors TS included in one touch block TB are electrically connected to one another, all the touch sensors TS included in the corresponding touch block TB are not normally operated even though a defect occurs only in one of the touch sensors TS. Therefore, as shown in FIG. 8, when the touch sensor electrode TSE of the touch sensor TS and the cathode electrode CE of the light emitting element are connected to each other to generate the defective touch sensor TS, the touch block TB in which the defective touch sensor TS is included fails to sense a touch of a user.

In the transparent display panel 110 according to one embodiment of the present disclosure, the defective touch sensor TS may be detected when the defective touch sensor TS is generated. In the transparent display panel 110 according to one embodiment of the present disclosure, the detected defective touch sensor TS and the touch bridge line TBL may be electrically separated from each other through a repair process. In detail, in the transparent display panel 110 according to one embodiment of the present disclosure, the defective touch sensor TS and the touch bridge line TBL may be electrically separated from each other by cutting a touch connection portion TC, which connects the defective touch sensor TS with the touch bridge line TBL, through laser cutting. As a result, the other touch sensors TS of the corresponding touch block TB may be normally operated.

Hereinafter, the touch connection portion TC for connecting the touch sensor TS with the touch bridge line TBL, and laser cutting of the touch connection portion TC will be described in detail with reference to FIGS. 9 to 11.

Figure 9:
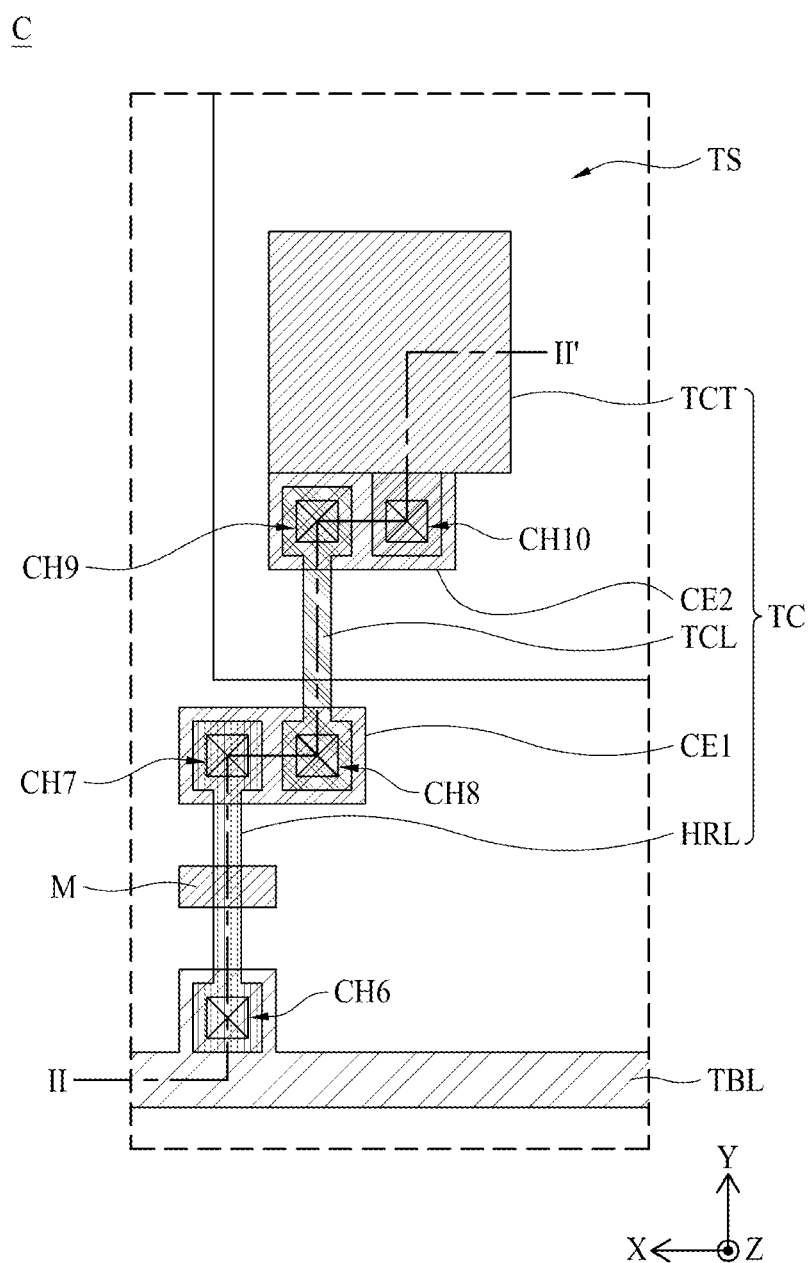
FIG. 9 is an enlarged view illustrating an area C of FIG. 3.
Figure 10:
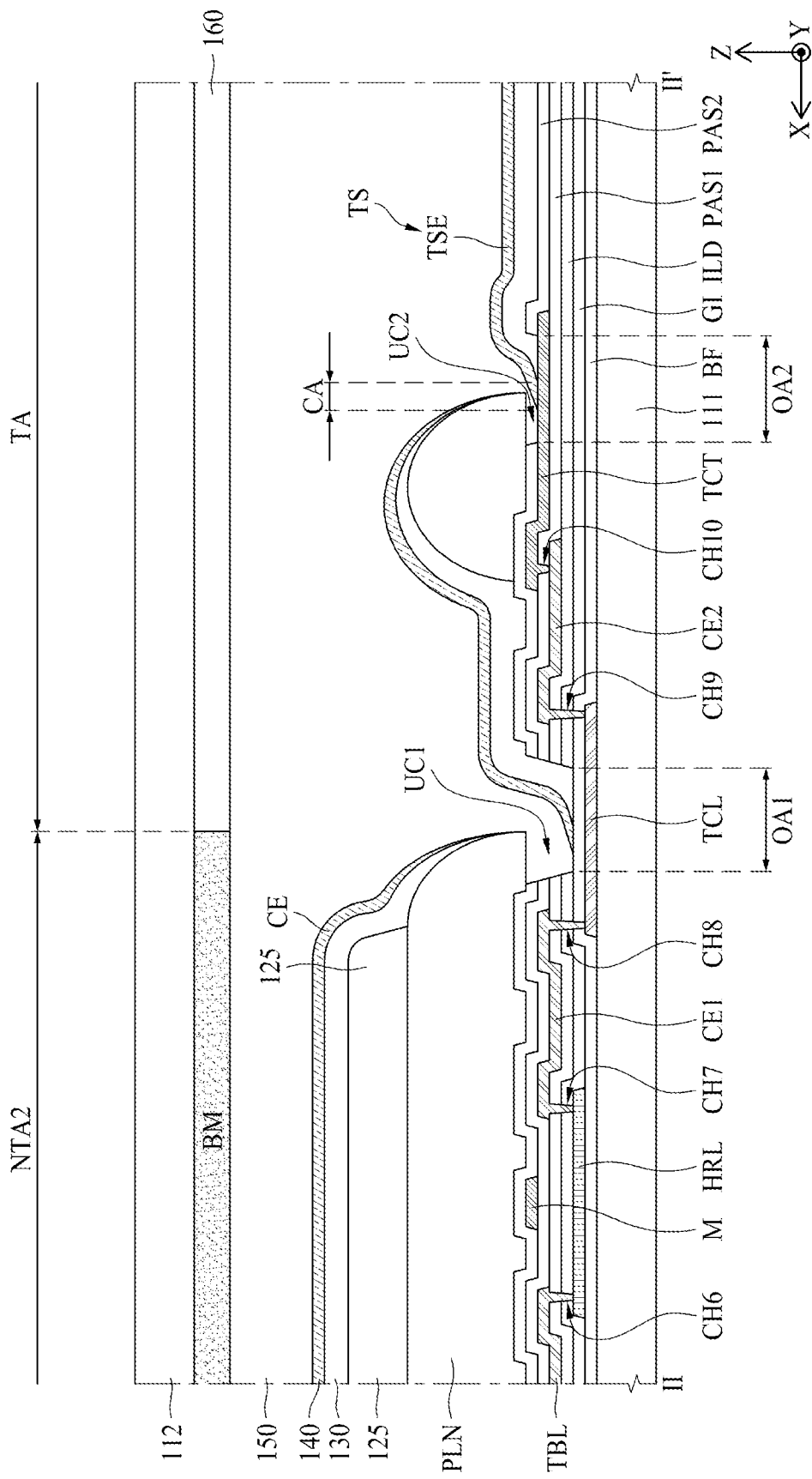
FIG. 10 is a cross-sectional view taken along line II-IP of FIG. 9.
Figure 11:
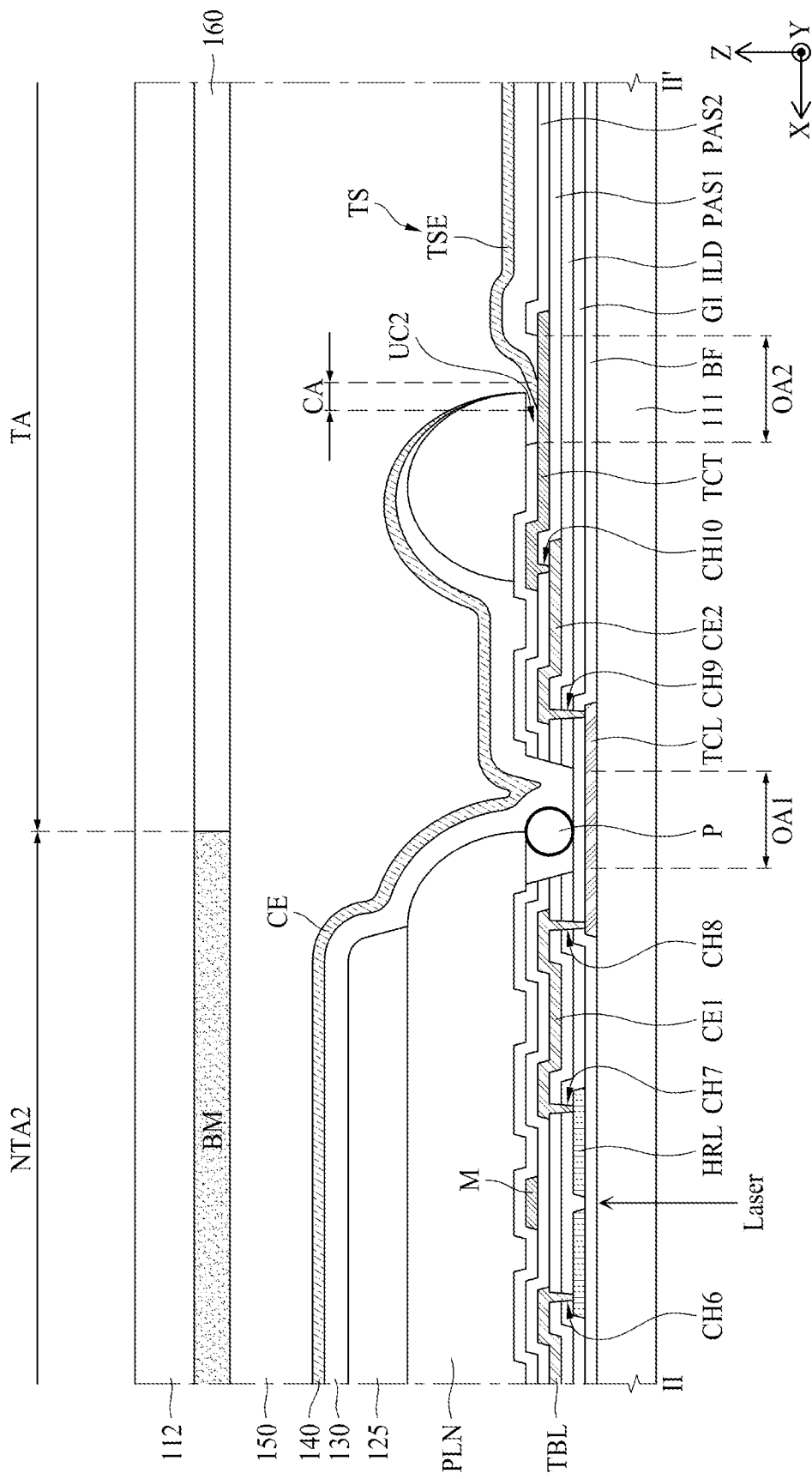
FIG. 11 is a view illustrating an example that a high resistance line is cut by a laser when a defective touch sensor is detected.

FIG. 9 is an enlarged view illustrating an area C of FIG. 3, FIG. 10 is a cross-sectional view taken along line II-IP of FIG. 9, and FIG. 11 is a view illustrating an example that a high resistance line is cut by a laser when a defective touch sensor is detected.

Referring to FIGS. 9 to 11, each of the plurality of touch sensors TS may be connected to the touch bridge line TBL through the touch connection portion TC.

At least a portion of each of the plurality of touch connection portions TC may overlap the touch sensor TS at one end and overlap the touch bridge line TBL at the other end to connect the touch sensor TS with the touch bridge line TBL. The touch connection portion TC may include a high resistance line HRL, a first connection electrode CE1, a touch connection line TCL, a second connection electrode CE2, and a touch contact electrode TCT.

The high resistance line HRL may be disposed between the first undercut structure UC1 and the touch bridge line TBL. One end of the high resistance line HRL may be connected to the touch bridge line TBL through a sixth contact hole CH6, and the other end thereof may be connected to the first connection electrode CE1 through a seventh contact hole CH7. In FIGS. 9 and 10, the high resistance line HRL is shown as being connected to the touch connection line TCL through the first connection electrode CE1, but is not limited thereto. In another embodiment, the high resistance line HRL may be directly connected to the touch connection line TCL through the seventh contact hole CH7.

The high resistance line HRL may include a high resistance area to detect a defective touch sensor TS. The transparent display panel 110 according to one embodiment of the present disclosure may detect a defective touch sensor by using the high resistance area.

In detail, in case of the defective touch sensor TS, the touch sensor electrode TSE of the touch sensor TS and the cathode electrode CE of the light emitting element may be electrically connected to each other as described above. For this reason, when respective voltages different from each other are applied to the touch line TL and the common power line VSS, respectively, in case of the defective touch sensor TS, a current flows from the touch sensor electrode TSE to the cathode electrode CE. At this time, when the high resistance area is provided on a current path, a voltage of the defective touch sensor TS is reduced. On the other hand, in case of a normal touch sensor TS, since no current flows to the touch sensor electrode TSE, the voltage applied from the touch line TL may be maintained.

In the transparent display panel 110 according to one embodiment of the present disclosure, respective voltages different from each other may be applied to the touch line TL and the common power line VSS, respectively, voltages of the touch sensors TS may be measured, and the defective touch sensor TS may be detected based on a voltage difference between the touch sensors TS. That is, in order to generate a voltage difference between the defective touch sensor TS and the normal touch sensor TS, a high resistance area should be provided.

In order to implement the high resistance area, the high resistance line HRL may be made of a silicon-based semiconductor material or an oxide-based semiconductor material, which has high resistance. For example, the high resistance line HRL may include the same material as that of the active layer ACT of the driving transistor TFT in the same layer as the active layer ACT of the driving transistor TFT.

The first connection electrode CE1 may electrically connect the high resistance line HRL with the touch connection line TCL. The first connection electrode CE1 may be connected to the high resistance line HRL through the seventh contact hole CH7 at one end, and may be connected to the touch connection line TCL through an eighth contact hole CH8 at the other end.

The first connection electrode CE1 may be disposed in a layer provided between the high resistance line HRL and the touch connection line TCL. In one embodiment, the first connection electrode CE1 may be disposed in the same layer as the source electrode SE and the drain electrode DE of the driving transistor TFT.

The touch connection line TCL may be disposed between the high resistance line HRL and the touch contact electrode TCT to electrically connect the high resistance line HRL with the touch contact electrode TCT. One end of the touch connection line TCL may be connected to the first connection electrode CE1 through the eighth contact hole CH8, and may be electrically connected to the high resistance line HRL through the first connection electrode CE1, but the touch connection line TCL is not limited thereto. The touch connection line TCL may be directly connected to the high resistance line HRL. The other end of the touch connection line TCL may be connected to the second connection electrode CE2 through a ninth contact hole CH9, and may be electrically connected to the touch contact electrode TCT through the second connection electrode CE2, but the touch connection line TCL is not limited thereto. The touch connection line TCL may be directly connected to the touch contact electrode TCT.

The touch connection line TCL may be formed in a layer provided between the first substrate 111 and the driving transistor TFT. In one embodiment, the touch connection line TCL may include the same material as that of the light shielding layer LS in the same layer as the light shielding layer LS. The touch connection line TCL may be extended across the first undercut structure UC1. The first undercut structure UC1 may be formed through a wet etching process. In the transparent display panel 110 according to one embodiment of the present disclosure, the touch connection line TCL may be formed in the same layer as the light shielding layer LS so that the touch connection line TCL may be prevented from being lost in the wet etching process for forming the first undercut structure UC1.

The second connection electrode CE2 may electrically connect the touch connection line TCL with the touch contact electrode TCT. The second connection electrode CE2 may be connected to the touch connection line TCL through the ninth contact hole CH9 at one end, and may be connected to the touch contact electrode TCT through a tenth contact hole CH10 at the other end. The second connection electrode CE2 may be disposed in a layer provided between the touch connection line TCL and the touch contact electrode TCT. In one embodiment, the second connection electrode CE2 may be disposed in the same layer as the source electrode SE and the drain electrode DE of the driving transistor TFT.

The touch contact electrode TCT may be provided in the transmissive area TA. The touch contact electrode TCT may be disposed between the touch connection line CL and the touch sensor electrode TSE to electrically connect the touch connection line CL with the touch sensor electrode TSE. The touch contact electrode TCT may be connected to the second connection electrode CE2 through the tenth contact hole CH10, and may be electrically connected to the touch connection line TCL through the second connection electrode CE2, but the touch contact electrode TCT is not limited thereto. The touch contact electrode TCT may be directly connected to the touch connection line TCL.

Also, at least a portion of an upper surface of the touch contact electrode TCT may be exposed by the second undercut structure UC2, and the touch sensor electrode TSE may be connected to the exposed upper surface. The transparent display panel 110 according to one embodiment of the present disclosure may form the second undercut structure UC2 by using the planarization layer PLN and the second passivation layer PAS2.

In detail, the touch contact electrode TCT may be formed in a layer provided between the buffer layer BF and the second passivation layer PAS2. In one embodiment, the touch contact electrode TCT may be provided between the first passivation layer PAS1 and the second passivation layer PAS2. In this case, the second passivation layer PAS2 may be provided with a second opening area OA2 that exposes at least a portion of the upper surface of the touch contact electrode TCT. The second undercut structure UC2 may be formed in such a manner that the planarization layer PLN is more protruded than the second passivation layer PAS2 in the second opening area OA2 of the second passivation layer PAS2. Therefore, the second undercut structure UC2 may expose at least a portion of the lower surface of the planarization layer PLN, and may expose at least a portion of the upper surface of the touch contact electrode TCT without having the second passivation layer PAS2 below the exposed lower surface.

The second undercut structure UC2 may be provided inside the area in which the first undercut structure UC1 is provided. In detail, the second undercut structure UC2 may be disposed in the touch sensor TS.

In the transparent display panel 110 according to one embodiment of the present disclosure, the touch sensor electrode TSE may be connected to the touch contact electrode TCT by the second undercut structure UC2. In detail, at least a portion of the upper surface of the touch contact electrode TCT may be exposed by the second undercut structure UC2. The touch sensor electrode TSE may be deposited on the exposed upper surface of the touch contact electrode TCT and thus connected to the touch contact electrode TCT. The touch contact electrode TCT may transfer a change in capacitance of the touch sensor electrode TSE to the touch line TL through the touch connection line TCL, the high resistance line HRL and the touch bridge line TBL.

In the transparent display panel 110 according to one embodiment of the present disclosure, as shown in FIG. 11, the touch sensor electrode TSE of the touch sensor TS and the cathode electrode CE of the light emitting element may be electrically connected to each other by particles PRT. In the transparent display panel 110 according to one embodiment of the present disclosure, when the defective touch sensor TS is detected, the touch connection portion TC for connecting the defective touch sensor TS with the touch bridge line TBL may be subjected to laser cutting, so that the defective touch sensor TS and the touch bridge line TBL may be electrically separated from each other. As a result, the other touch sensors TS of the corresponding touch block TB may be normally operated.

In the transparent display panel 110 according to one embodiment of the present disclosure, the high resistance line HRL may be cut from the touch connection portion TC by laser as shown in FIG. 11. The high resistance line HRL may be made of a silicon-based semiconductor material or an oxide-based semiconductor material. The silicon-based semiconductor material or the oxide-based semiconductor material is likely to be more thermally condensed than a metal material such as Cu during laser irradiation, thereby generating high heat. Therefore, the silicon-based semiconductor material or the oxide-based semiconductor material may be better cut than other metal materials. That is, in the transparent display panel 110 according to one embodiment of the present disclosure, the high resistance line HRL made of a silicon-based semiconductor material or an oxide-based semiconductor material may be subjected to laser cutting to certainly make sure of the electrical isolation between the defective touch sensor TS and the touch bridge line TBL.

Also, in the transparent display panel 110 according to one embodiment of the present disclosure, the high resistance line HRL provided in the same layer as the active layer ACT of the driving transistor TFT may be subjected to laser cutting, so that a repair may be performed without damaging the light emitting element provided over the high resistance line HRL.

Meanwhile, the transparent display panel 110 according to one embodiment of the present disclosure may further include a metal pattern M provided to overlap at least a portion of the high resistance line HRL. Since the high resistance line HRL is made of a transparent silicon-based semiconductor material or oxide-based semiconductor material, it is difficult to identify an exact position of the high resistance line HRL in the transparent display panel 110. Therefore, in the transparent display panel 110 according to one embodiment of the present disclosure, a metal pattern M may be provided to overlap at least a portion of the high resistance line HRL, particularly a laser cutting line. In the transparent display panel 110 according to one embodiment of the present disclosure, the metal pattern M include an opaque metal, so that an area to be irradiated with a laser may be easily detected during a repair process.

In the transparent display panel 110 according to one embodiment of the present disclosure, the metal pattern M may be provided over the high resistance line HRL. In the transparent display panel 110 according to one embodiment of the present disclosure, the laser may be irradiated to the lower surface of the first substrate 111 to cut the high resistance line HRL. At this time, the transparent display panel 110 according to one embodiment of the present disclosure may prevent laser reflection and energy loss from occurring through the metal pattern M provided over the high resistance line HRL. Therefore, the transparent display panel 110 according to one embodiment of the present disclosure may make sure of stability of the repair process.

Meanwhile, in the transparent display panel 110 according to one embodiment of the present disclosure, the metal pattern M may be provided between the first passivation layer PAS1 and the second passivation layer PAS2. The metal pattern M is not electrically connected to the high resistance line HRL, and may be a metal pattern that is electrically floated. When the metal pattern M is electrically connected to the high resistance line HRL, resistance of the high resistance line HRL may be lowered, whereby high resistance may not be obtained. Therefore, the metal pattern M may be insulated from the high resistance line HRL.

In the transparent display panel 110 according to one embodiment of the present disclosure, particles may occur between the metal pattern M and the high resistance line HRL during the manufacturing process. When a distance between the metal pattern M and the high resistance line HRL is not sufficient, the metal pattern M and the high resistance line HRL may be short-circuited in the area in which particles occur.

In the transparent display panel 110 according to one embodiment of the present disclosure, the metal pattern M may be provided between the first passivation layer PAS1 and the second passivation layer PAS2 to make sure of a sufficient distance between the metal pattern M and the high resistance line HRL, and a short between the metal pattern M and the high resistance line HRL may be prevented from occurring even though particles occur between the metal pattern M and the high resistance line HRL.

According to the present disclosure, the following advantageous effects may be obtained.

In the present disclosure, the touch sensor electrode of the touch sensor and the cathode electrode of the light emitting element are formed using the first undercut structure at the same time, so that the touch process may be simplified and a separate mask for the touch sensor electrode is not additionally required.

Also, in the present disclosure, the high resistance line is provided in the touch connection portion for connecting the touch sensor with the touch bridge line, so that the defective touch sensor may be detected in the block.

Also, in the present disclosure, the repair process may be performed for the high resistance line made of a silicon-based semiconductor material or an oxide-based semiconductor material by laser cutting when the defective touch sensor is detected. The present disclosure may facilitate laser cutting without damage to the light emitting element.

Also, in the present disclosure, the metal pattern made of an opaque metal is provided over the high resistance line, so that the area to be irradiated with a laser may be easily detected. In addition, the present disclosure may improve stability of the repair process by preventing laser reflection and energy loss from occurring through the metal pattern during laser irradiation.

Also, in the present disclosure, the metal pattern may be provided between the first passivation layer and the second passivation layer to make sure of the sufficient distance between the metal pattern and the high resistance line, and a short between the metal pattern and the high resistance line may be prevented from occurring even though particles occur between the metal pattern and the high resistance line Also, in the present disclosure, the touch connection line crossing the first undercut structure may be formed in the same layer as the light shielding layer, so that the touch connection line may be prevented from being lost in the wet etching process for forming the first undercut structure.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is intended to cover all variations or modifications derived from the meaning, scope and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A display device comprising:
a substrate provided with a plurality of transmissive areas through which externally incident light passes and a non-transmissive area disposed between the transmissive areas adjacent to each other, the non-transmissive area including a plurality of light emission areas;

a plurality of light emitting elements respectively provided in the plurality of light emission areas over the substrate, and including an anode electrode, a light emitting layer, and a cathode electrode;

a plurality of driving transistors electrically connected to the anode electrode of each of the light emitting elements, including an active layer, a gate electrode, a source electrode, and a drain electrode;

a plurality of touch sensors respectively provided in the plurality of transmissive areas over the substrate, and including a plurality of touch sensor electrodes provided in a same layer as the cathode electrode;

a plurality of touch bridge lines provided in the non-transmissive area;

a plurality of touch connection portions electrically connecting the plurality of touch bridge lines with the plurality of touch sensors; and a first undercut structure provided in the transmissive area, having a planar closed shape, wherein the anode electrode is provided over the substrate, the light emitting layer is disposed over the anode electrode, the cathode electrode is disposed over the light emitting layer, wherein the active layer is disposed between the substrate and the anode electrode, the gate electrode is disposed on the active layer, the source electrode and the drain electrode are disposed on the gate electrode, wherein a touch contact electrode is provided in the transmissive area and a touch connection line is formed in a layer provided between the substrate and one of the plurality of driving transistors, wherein each of the plurality of touch sensor electrodes provided in each of the plurality of transmissive areas is arranged to be spaced apart from the light emission area, wherein the cathode electrode and the touch sensor electrode are separated from each other by the first undercut structure, and wherein the touch connection line has one end electrically connected to the touch contact electrode, and is extended across the first undercut structure.

2. The display device of claim 1, further comprising a light shielding layer provided between the substrate and the driving transistor, wherein the touch connection line is provided in a same layer as the light shielding layer.

3. The display device of claim 1, wherein each of the plurality of touch connection portions further includes a high resistance line provided between the touch connection line and the touch bridge line and made of a same material as that of the active layer of the driving transistor.

4. The display device of claim 3, further comprising a metal pattern provided over the high resistance line, having at least a portion overlapped with the high resistance line.

5. The display device of claim 4, wherein the metal pattern is formed in a layer provided between the driving transistor and the anode electrode.

6. The display device of claim 4, wherein the touch connection portion electrically connected to a defective touch sensor is cut by a laser in an area overlapped with the metal pattern in the high resistance line.

7. A display device comprising:
a substrate provided with a plurality of display area and a plurality of non-display area;

a common power line formed on the same layer as a light shielding layer disposed on the substrate;

a driving transistor disposed on the light shielding layer;

a planarization layer covering the driving transistor and the common power line;

an anode electrode, an organic light emitting layer, and a cathode electrode sequentially stacked on the planarization layer;

a first signal line extending in the same direction as the common power line; and a second signal line that overlaps the common power line and extends in a different direction from the common power line, wherein the first signal line and the second signal line are electrically connected.

8. The display device of claim 7, further comprising an opening area disposed between the display area and the non-display area, wherein the opening area is partially formed along one side of the display area.

9. The display device of claim 8, further comprising a plurality of inorganic layers between the substrate and the planarization layer, wherein the opening area is an undercut structure formed by partially removing the planarization layer and the plurality of inorganic layers.

10. The display device of claim 9, wherein the planarization layer protrudes beyond the plurality of inorganic layers in the undercut structure.

11. The display device of claim 8, wherein the planarization layer is separated by the opening area.

12. The display device of claim 8, wherein the cathode electrode is separated by the opening area.

13. The display device of claim 12, wherein the non-display area includes the cathode electrode separated by the opening area, wherein the cathode electrode separated by the opening area and provided in the non-display area is a touch electrode.

14. The display device of claim 13, further comprising a touch connection portion electrically connecting the touch electrode and the second signal line, wherein the touch connection portion includes a high resistance line.

15. The display device of claim 14, wherein the high resistance line is made of at least one of a silicon-based semiconductor material or an oxide-based semiconductor material.

16. The display device of claim 14, further comprising a metal pattern disposed over the high resistance line, the metal pattern having at least a portion overlapped with the high resistance line.

17. The display device of claim 16, wherein the metal pattern is electrically floated.

18. The display device of claim 8, further comprising a bank covering an edge of the anode electrode, wherein the bank is separated by the opening areas.

19. The display device of claim 7, wherein the first signal line extends in a first direction, wherein the second signal line is parallel to a gate line extending in a second direction.

20. The display device of claim 7, wherein the first signal line is a touch line, wherein the second signal line is a touch bridge line.

* * * * *